United States Patent
Visvanathan et al.

(10) Patent No.: US 7,275,223 B2
(45) Date of Patent: Sep. 25, 2007

(54) FACILITATING HIGH-LEVEL VALIDATION OF INTEGRATED CIRCUITS IN PARALLEL WITH DEVELOPMENT OF BLOCKS IN A HIERARCHICAL DESIGN APPROACH

(75) Inventors: Venkatasubramanyam Visvanathan, Bangalore (IN); Sharad Arora, Meerut (IN); Sivakumar Ramaiyan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 160 days.

(21) Appl. No.: 11/160,631

(22) Filed: Jul. 1, 2005

(65) Prior Publication Data
US 2006/0265673 A1    Nov. 23, 2006

(30) Foreign Application Priority Data
May 18, 2005    (IN) .......................... 593/CHE/2005

(51) Int. Cl.
*G06F 17/50* (2006.01)

(52) U.S. Cl. ...................... 716/1; 716/7; 716/9; 716/12

(58) Field of Classification Search .................... 716/1, 716/7, 12
See application file for complete search history.

(56) References Cited

U.S. PATENT DOCUMENTS 5,801,958 A * 9/1998 Dangelo et al. .............. 716/18
5,966,530 A * 10/1999 Shen et al. .................. 712/244

OTHER PUBLICATIONS

G.W. Doerre and D.E.Lackey "The IBM ASIC/SoC methodology - A recipe for first-time success", IBM Journal of Research and Development, Nov. 2002, pp. 649-660 (12 Pages), vol. 46 No. 6, IBM Corporation.

J.Y.Sayah, R.Gupta, D.D.Sherlekar, P.S. Honsinger, J.M.Apte, S.W. Bollinger, H.H.Chen; S.Dasgupta, E.P.Hsieh, A.D.Huber, E.J. Hughes, Z.M.Kurzum, V.B.Rao, T.Tabtieng, V. Valijan and D.Y. Yang, "Design Planning for high-performance ASICs", IBM Journal of Research and Development, 1996, pp. 1-23, vol. 40, No. 4, IBM Corporation.

* cited by examiner

*Primary Examiner*—Thuan Do
(74) *Attorney, Agent, or Firm*—Alan K. Stewart; W. James Brady; Frederick J. Telecky, Jr.

(57) ABSTRACT

A design management tool which automates the parallel validation of an entire integrated circuit while the individual blocks (together forming the integrated circuit) are designed. In an embodiment, a designer specifies various checkpoints associated with each design stage, and the specific information to be made available to a top level performing the validation. When each checkpoint is reached for a design block, the specified information is made available to the top level and the validation of the integrated circuit is performed up to that checkpoint. As a result, design closure of the integrated circuit can be obtained quickly.

18 Claims, 4 Drawing Sheets

FACILITATING HIGH-LEVEL VALIDATION OF INTEGRATED CIRCUITS IN PARALLEL WITH DEVELOPMENT OF BLOCKS IN A HIERARCHICAL DESIGN APPROACH

BACKGROUND OF THE INVENTION

1. Field of the Invention

The present invention relates software tools used in computer aided design (CAD) of integrated circuits, and more specifically to a method and apparatus for facilitating validation of entire integrated circuits in parallel with development of blocks in a hierarchical design approach.

2. Related Art

Integrated circuits (ICs) are generally designed in number of design stages using different design tools. Design tools provides various design data in the form of file. For example, a netlist provides the connection details of the integrated circuit, another file provides the description of the layout of gates/components. The design data available from each stage of the design process is provided to various modeling, simulation/test tools to measure performance metrics (or constraints) such as timing, size, etc.

However, with the increasing number of design elements (e.g. multi million gates etc) in an integrated circuit, the performance requirements may increasingly become stringent. Design process may become complex and difficult to manage due to correspondingly increased amount of data generated by design tools supporting such large scale design.

Hierarchical design approaches are often used to address such complex and large integrated circuit designs. In a hierarchical design approach, the design is divided into a number of manageable blocks or sub-chips (connected potentially by corresponding interface/glue logic). Different groups can potentially work on different blocks in parallel. In general, the design (including testing, measurement of various metrics related to constraints) of each block is completed in several stages ("design stages"). Design tools such as "First Encounter" (available from Cadence Design Systems, San Jose, Calif. 95134, 408.943.1234) can be used to divide the total design into the blocks or sub-chips.

According to one known prior hierarchical design approach, the blocks are independently designed, and each block is then verified for constraints such as timing, size, etc. After completion of design of all the blocks, various data (e.g., generated during the block design in the form of files) representing the block size and shape, I/O (input/output), timing, pin locations, and other information required for the top level design process are provided to a top level design process (described below).

In a top level design, the data received from design of all the individual blocks is used to validate/test the entire integrated circuit, along with any contained glue logics. One disadvantage with such an approach is, the increase in design time as the top level design is started only after completion of design of all the blocks.

Hence what is needed is a method and apparatus for facilitating validation of entire integrated circuits in parallel with development of blocks in a hierarchical design approach.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention enables parallel/concurrent validation of entire integrated circuit with design/validation of individual blocks (of the integrated circuit) generated by a hierarchical design. As a result, the time to design integrated circuits may be reduced.

Such a feature is attained in an embodiment by determining completion of design of blocks of interest up to a checkpoint corresponding to a non-last design stage, and making available to a top level the design data for the blocks up to said checkpoint. The design of the integrated circuit is validated up to the checkpoint using the design data received from all the blocks.

According to another aspect, several of such checkpoints (at various design stages of interest) and associated data that would be required at the top level, can be easily indicated. The indicated data is automatically made available to the top level upon reaching the corresponding checkpoint in the design cycle.

According to one more aspect of the present invention, a user interface is provided which enables a top-level designer to easily allocate the responsibility of different blocks (and different design stages) to different users and view status information indicating whether the design of each block has reached a checkpoint of interest. Thus, the top-level designer can initiate validation of the integrated circuit at a convenient time based on the status information.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Integrated Circuit.

Figure 1:
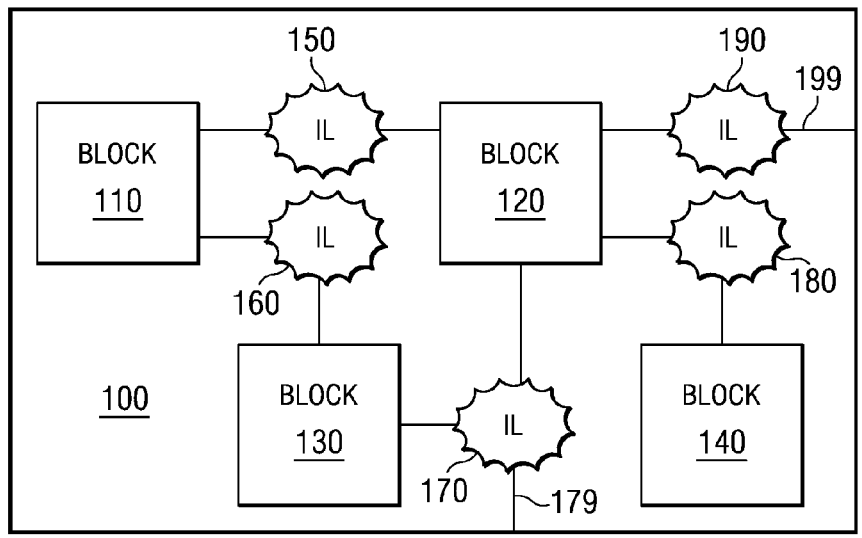
FIG. 1 is a block diagram illustrating an example integrated circuit which can be implemented using several aspects of the present invention.

FIG. 1 is a block diagram illustrating an example integrated circuit 100 which can be implemented using several aspects of the present invention. Integrated circuit 100 is shown containing blocks 110, 120, 130, and 140, and interface/glue logics (IL) 150, 160, 170, 180 and 190. Each component is described below in further detail.

Blocks 110, 120, 130, and 140 represent divided design portions of integrated circuit 100 according to a hierarchical design approach. Interface logics 150, 160, 170 and 180 respectively provide interface between block pairs 110 and 120, 110 and 130, 120 and 130, and 120 and 140. Interface logic 170 is in addition shown providing an external interface to integrated circuit 100 on path 179. Interface logic 190 also provides an external interface on path 199.

Various aspects of the present invention enable integrated circuit 100 to be designed using a hierarchical approach as described below in further detail. First, the general approach to design the integrated circuits is illustrated with examples.

3. General Approach

Figure 2:
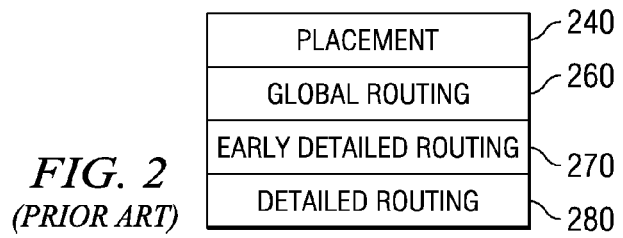
FIG. 2 is a block diagram illustrating example design stages in an iteration of design cycle related to integrated circuits.

As noted above, integrated circuit 100 is divided into various blocks and interface logics. Each block 110, 120, 130, and 140 is generally designed iteratively in multiple design stages. For brevity and to avoid obscuring the features of the invention, the design stages are assumed to contain placement 240 (where on the fabricated die would each block and the further components of the block would reside), global routing 260 (locating the major signal paths between, as well as within, blocks), early detailed routing 270 (connecting to the major signal paths), and detailed routing 280 (considering timing and other constraints) as shown in FIG. 2.

Figure 3:
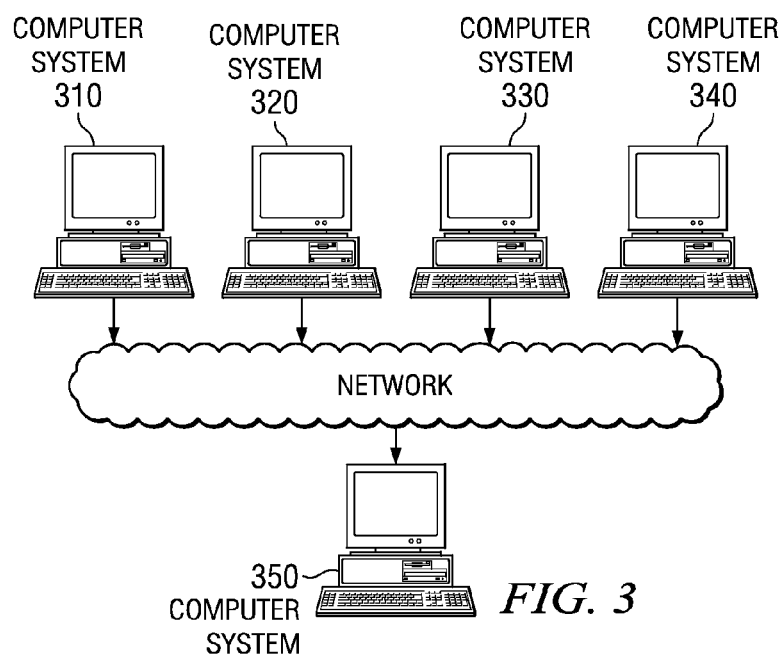
FIG. 3 is a block diagram illustrating an example network environment in which design of each blocks are performed in different computer systems.

The design generally entails validation of each block according to various functional requirements and performance constraints and the design of different blocks may be performed on different computer systems as illustrated with respect to FIG. 3. For illustration, it is assumed that the design data generated for various blocks 110, 120, 130 and 140 is respectively stored on directories contained in computer systems 310, 320, 330 and 340, and computer system 350 is used for validation of integrated circuit 100. Such validation is referred to as 'top level' since the entire integrated circuit may be validated using the information generated in systems 310, 320, 330 and 340. Several computer systems can be used in the design of each design block, though conveniently the design data (design space) for each block is stored in a single computer system.

As noted above, in one prior embodiment, the design data (after validation of the blocks) is provided for validation of the entire integrated circuit. If the results are deemed not to be acceptable, the design may be continued in another iteration. Such a prior approach may lead to unacceptably long time for design closure. An aspect of the present invention overcomes such a disadvantage as described below in further detail.

4. Parallel Development

Figure 4:
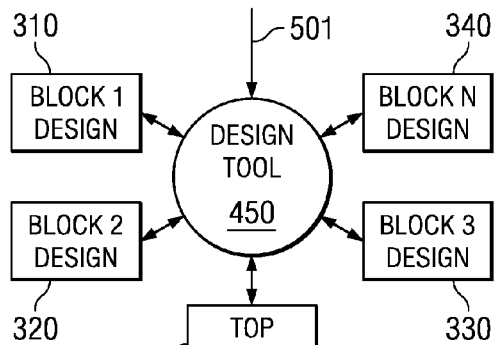
FIG. 4 is a block diagram illustrating manner in which high level verification of integrated circuits can be performed in parallel according to an aspect of the present invention.

FIG. 4 is a block diagram illustrating logically the manner in which high level validation of integrated circuits can be performed in parallel with development of individual blocks in a hierarchical design approach according to an aspect of the present invention. The block diagram is shown containing design management tool 450 which interfaces with computer systems 310, 320, 330, 340 and 350 to attain such parallelism.

Broadly, design management tool 450 interfaces with the individual systems storing the design space (directory) and provides the relevant design data for validation at a top level, potentially as soon as (indicated by checkpoints in the below description) such design data becomes available. The operation of design management tool 450 to attain such features is described below in further detail.

Figure 5:
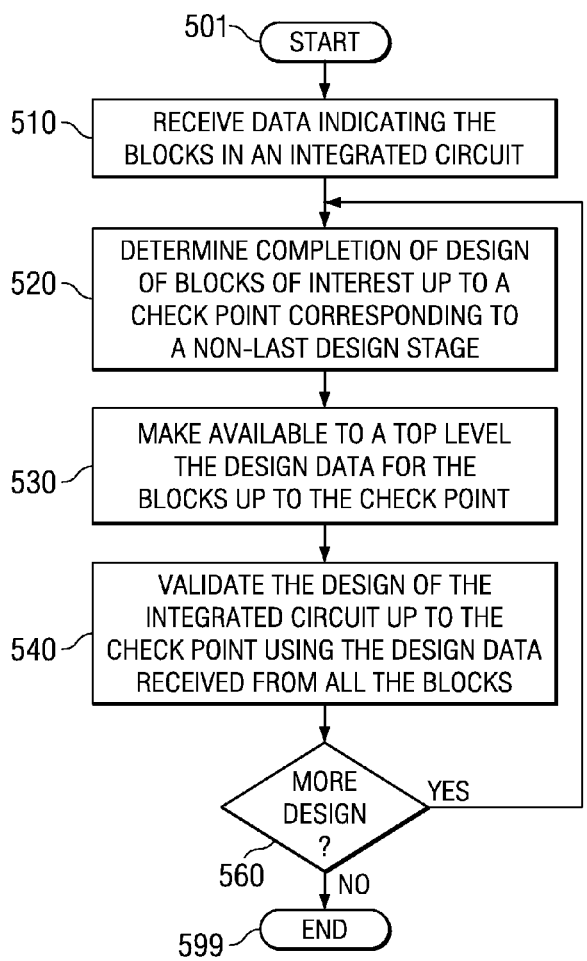
FIG. 5 is a flowchart illustrating the operation of a design management tool provided according to an aspect of the present invention.

FIG. 5 is a flowchart illustrating the operation of a design management tool provided according to an aspect of the present invention. The flowchart is described with reference to FIGS. 1-4 for illustration. However, the approaches can be implemented in other environments, without departing from the scope and spirit of various aspects of the present invention. The flowchart begins in step 501, in which control immediately passes to step 510.

In step 510, design management tool 450 receives data indicating the blocks in an integrated circuit. With reference to FIG. 1, design management tool 450 may receive data indicating that integrated circuit 100 contains blocks 110, 120, 130 and 140 (along with other interface logics) and also that the corresponding designs are being performed on computer systems 310, 320, 330 and 340 respectively. As noted in the background section, commercially available tools may be used to divide an integrated circuit into blocks and the corresponding results may be received by design management tool 450.

In step 520, design management tool 450 determines completion of design of blocks of interest up to a checkpoint corresponding to a non-last design stage. A checkpoint refers to a state of the design cycle at which design can be validated for specific requirements. Checkpoints are further illustrated with examples in sections below. In an embodiment described below, the determination is based on a notification received by user actions. Alternative approaches (e.g., which examine various outputs generated by design tools, etc.) can also be employed for such determination.

In step 530, design management tool 450 makes available to a top level the design data of the blocks up to the checkpoint. With reference to FIG. 4, design management tool 450 receives design data from computer systems 310, 320, 330 and 340, and makes the design data available to top level executing on computer system 350.

In step 540, the design of the integrated circuit is validated up to the checkpoint using the design data received from the blocks of interest. Such validation can be performed in a known way. In step 550, a determination is made as to whether more design (or design stages) is to be completed for integrated circuit 100. Control passes to step 520 if more design is there, and to step 599 otherwise. The flowchart ends in step 599.

As may be appreciated from the flowchart above, the validation of integrated circuits can be completed at each checkpoint as soon as the design stage of the blocks is completed up to the checkpoint. Accordingly, high level validation of integrated circuits is performed in parallel with development of individual blocks, thereby reducing the time for design closure.

As noted above, top level design is validated at various checkpoints based on the corresponding design data received from the design of individual blocks. As may be appreciated, multiple checkpoints can be present associated with each design stage as described below with reference to an example design stage.

5. Checkpoints in Detail Routing

Figure 6:
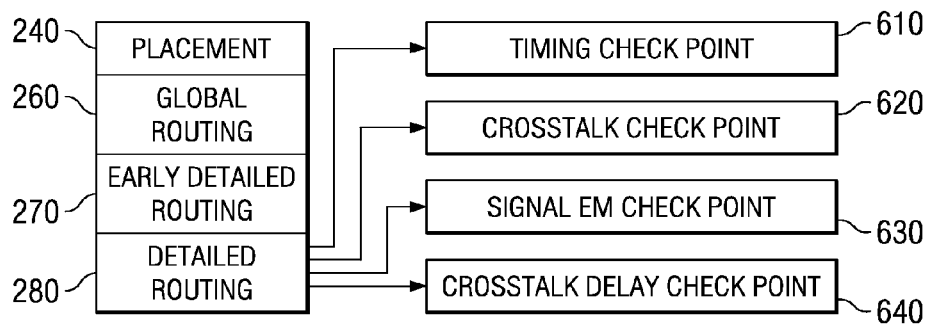
FIG. 6 illustrates an example set of checkpoints in a detailed routing design stage.

FIG. 6 illustrates an example set of checkpoints in a detailed routing design stage. Entire integrated circuit is verified up to each checkpoints when the blocks are designed and verified up to corresponding checkpoints in a detail routing design stage. The set is shown containing timing checkpoint 610, cross talk noise checkpoint 620, signal EM checkpoint 630, and cross talk delay checkpoint 640. Each checkpoint and the design data transferred are described briefly below.

Timing checkpoint 610 corresponds to a state of the design stage in which sufficient design data is present for verification of timing synchronisation of various signals. Each block typically completes the detail routing design and performs the verification of timing at the corresponding timing checkpoint. At the top level, timing verification of entire integrated circuit is performed using results (timing models generated by various tools available in the marketplace) of timing checkpoint blocks.

Generally, timing analysis at the top level is performed using models of the blocks such as ILM (available from Synopsys, Mountain View, Calif., Phone: (650) 584-5000 or (800) 541-7737), etc., and data of the model is represented in formats such as SDF, SPEF etc., well known in the relevant arts. Each block designer generates models after designing the detail routing (or after any particular design stage) of block using various modeling tools. Top design is provided with data representing the model to verify the timing of the entire integrated circuit.

Tools from synopsis provides a ILM model of the blocks representing the interface details of the blocks. The model may be provided to top level as a file (in a Verilog format, .v extension) containing details of ILM model. Similarly timing analysis is also performed using SPEF and SDF models of the block to verify different aspect timing.

Crosstalk noise checkpoint 620 corresponds to a state of the design stage in which sufficient design data is present for verification of signal integrity of the entire integrated circuit. Signal integrity verification is performed at the top level for a desired design stage after completion of the corresponding design stages at the block level. Each blocks are modeled for cross talk verification with an user defined noise (UDN) model or with an ECHO model generated by CELTIC tool available from Cadence Design Corporation. CELTIC tool provides the ECHO model of the blocks in number of files such as glitch, ECHO etc. The files are transferred to top level for performing the verification of entire integrated circuit as soon the corresponding model of blocks are generated.

Similarly, signal EM checkpoint 630 corresponds to a state of the design stage in which sufficient design data is present for verification of signal integrity due to electro migration problem well known in the field of relevant art. Model of the blocks in SPEF format or Verilog format are used for verifying the signal EM at the top level.

Crosstalk delay checkpoint 640 also corresponds to a state of the design stage in which sufficient design data is present for verification of signal integrity due to delay caused to various signal on the signal path caused by cross talk glitch. Crosstalk delay verification is performed using coupling compensated ILM model of the blocks at the top level. Verification is performed similar to the timing verification. The corresponding models may be represented in various formats such as Verilog or SPEF formats.

It should be understood that example checkpoints are described above merely for illustration. Depending on the requirements as determined at the top level, additional checkpoints would be used in the detailed routing stage. Similarly, checkpoints may be included in other design stages as well.

Similarly, while multiple checkpoints are shown associated with each design stage, in an alternative embodiment, a checkpoint may indicate completion of a stage. The design management tool may then automatically perform several tasks (akin to all the checkpoints combined of FIG. 6 above) in after reaching the checkpoint.

Various user interfaces can be provided using the approaches described above. The description is continued with respect to an example user interface.

6. User Interface

Figure 7:
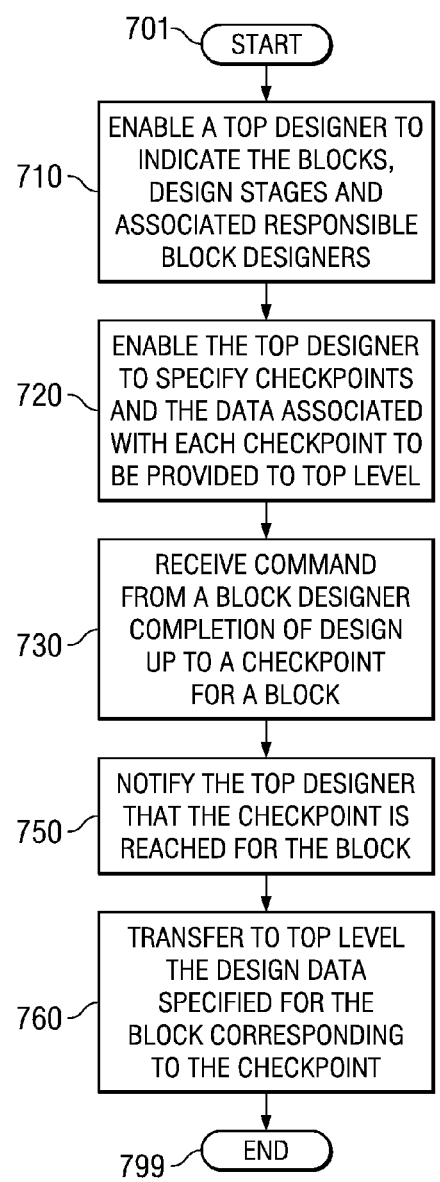
FIG. 7 is a flowchart illustrating the user interface provided by a design management tool in one embodiment

FIG. 7 is a flowchart illustrating the user interface provided by design management tool 450 in one embodiment. The flowchart is described with respect to FIG. 4 merely for illustration. Various features described herein, can be implemented in other environments as well. The flowchart starts in step 701, in which control transfers to step 710.

In step 710, design management tool 450 enables a top designer to indicate the blocks, design stages and associated responsible block designers. The step may be performed after the design planning phase (in which various responsible team leaders identified, blocks are determined, etc.) in a chip design cycle.

In step 720, design management tool 450 enables the top designer to specify checkpoints and the data associated with each checkpoint to be provided to top level. In an embodiment, the top designer merely edits a text file specifying the various checkpoints (identifiers) and corresponding files to be transferred to top level. As illustrated above, the common extensions used by the design tools and the directories in which the tools are designed to place the files, can be conveniently used to identify the files of interest.

In step 730, design management tool 450 receives a command from a block designer indicating completion of design up to a checkpoint for a block. Thus, the block designer can enter the corresponding command after being comfortable that the corresponding state of the design stage has been attained. The command can be issued by any suitable user interface (e.g., checking off a box, or entering a line of text expressly according to a command line interface).

In step 750, design management tool 450 notifies the top designer that the checkpoint is reached for the block. A suitable interface may be provided for the notification. For example, a table can be displayed indicating the notifications from various block designers of the specific checkpoints already reached.

In step 760, design management tool 450 automatically transfers to top level the design data specified for the block corresponding to the checkpoint. The information provided in step 720 is used to transfer the specific files. The top level can then use the file for validation of the entire integrated circuit. The method thus ends in step 799. The flowchart of above can be implemented in various embodiments. The details of an example implementation are provided below with reference to FIG. 8.

7. Example Implementation

Figure 8:
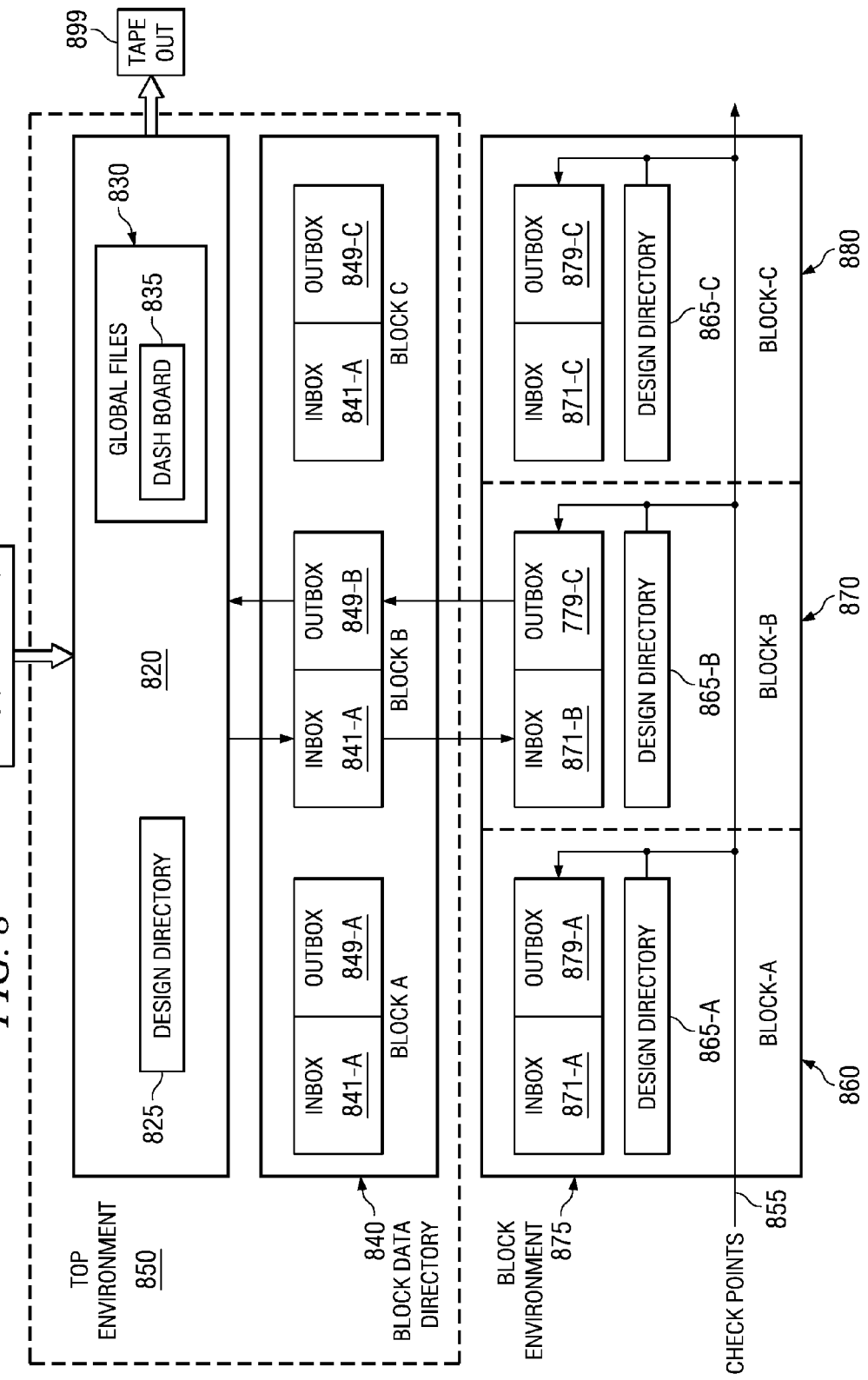
FIG. 8 is a block diagram illustrating design management tool implemented in example embodiment

FIG. 8 is a block diagram illustrating the concepts underlying design management tool 450 in one embodiment. The block diagram is shown containing design planning 810, top level environment 850, block environment 875 and tape out 899. Design management tool 450 may contain other components, which are not shown/described to avoid obscuring the features of the present invention. Each block is described below assuming that design management tool 450 is being used to design three separate blocks 860, 870 and 880, as described below in further detail.

Design planning 810 enables a designer to partition the integrated circuit into blocks (here 860, 870 and 880) and define various constraints (budgeting) for each block. Information for the physical design of the blocks (hereafter "primary inputs") such as netlist, pin assignment floor plan etc., (as noted above) is provided to top level environment 850. The corresponding data may be generated, for example, by "First Encounter" tool noted above.

Top level environment 850 is shown containing top level manager 820 and block data directory 840. Top level manager 820 is shown containing design directory 825, global files 830, and dash board 835. Block data directory 840 contains pairs of inbox and outbox corresponding to each block sought to be designed for an integrated circuit, as described below.

Design directory 825 refers to location/directory where various files for simulation, modeling and testing are stored. The files that need to be shared with individual block designs are identified as global files 830, which are managed by dashboard 835, as described below.

Dashboard 835 enables a top level designer to initiate the use of design management tool 450 and control various activities during the design/validation process. The top level designer may assign each block (based on the inputs received from design planning 810) to a corresponding designer to initiate the used of the tool. Dashboard 835 immediately notifies (e.g., by email) each assignment to the corresponding block designer, and also causes a pair of inbox and output to be created for each design block. Dashboard 835 displays the status of various block designs (in terms of specific checkpoints reached or not reached).

Inboxes 841A, 841B and 841C are shown created for blocks 860, 870 and 880 respectively in block data directory 840. Similarly, outboxes 849A, 849B and 849C are created for the three blocks. Other structures also may be created in block environment 875, as described in below paragraphs.

Inboxes 841A-841C and outboxes 849A-849C are present for communication between top level design 820 and block design 875. Thus, when a top level designer assigns blocks to block designers, inboxes 841A-841C respectively receive the primary inputs for blocks 860, 870 and 880. The data is buffered at least until the corresponding block designer chooses to receive the stored data.

Outboxes 849A-849C respectively receive various design data for blocks 860, 870 and 880 after a designer indicates that corresponding checkpoint is reached. The data is buffered for top level designer to use the design data for validation of the integrated circuit for the corresponding checkpoint.

Continuing the description with respect to block environment 875, there are shown inboxes 871A-871C, and outboxes 879A-879C. Each pair of inbox/outbox is created for a corresponding block design. The inboxes are used to receive primary data and also notification of errors noticed during validation of the entire integrated circuit for a checkpoint. The data is received into inboxes 871A-871C when the block designer chooses to receive the data (which would be after receiving notification of assignment of the design block). Design directory 865A-865C are used to store working copies during the design phase.

As may be appreciated, as the design phase 855 progresses through various checkpoints, the corresponding design data is pulled from design directory (e.g., 865A) and placed into outbox (879A). A notification of checkpoint having been reached, is sent to dashboard 835.

After the top designer is notified by dashboard, the designer pulls the corresponding checkpoint (design data) to outbox (849-A, 849-B, 849-C) in block data directory 840. The top designer may verify (in his design directory (825)) various functional and throughput performance requirements of the entire integrated circuit. Any changes(feedbacks) required to be made at block levels are sent to inbox (871-A, 871-B, 871-C) in the form of new changed design inputs for re-generation (design) up to the corresponding checkpoint with the new inputs. The feedback from top-level may continue till the desired full-chip performance is achieved (design closure).

As the design process ends, the data representing the integrated circuit is ready for tapeout as represented by tapeout 899. Thus, due to the use of design management tool 450, a design team may conveniently cause parallel validation of an entire integrated circuit while the individual blocks are designed.

The features described above can be implemented in several embodiment. The design management tool noted above may be implemented in a digital processing system as described below.

8. Digital Processing System

Figure 9:
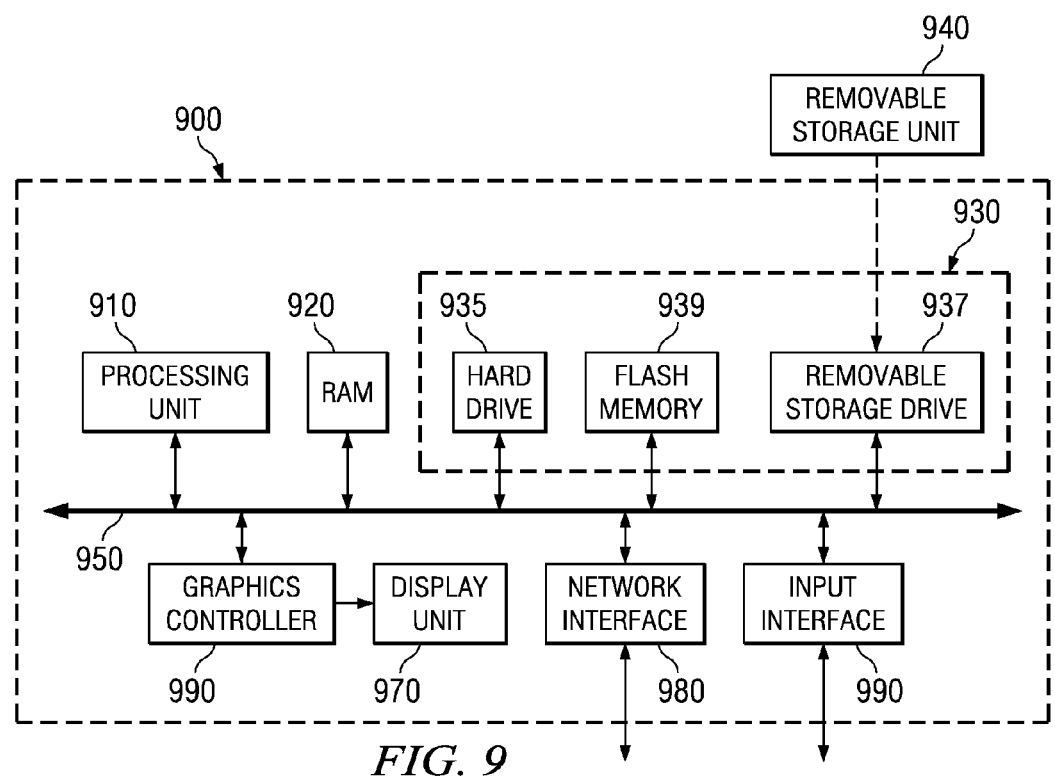
FIG. 9 is a block diagram of a computer system illustrating an example system for implementing a design management tool provided according to an aspect of the present invention.

FIG. 9 is a block diagram of computer system 900 illustrating an example system for implementing design management tool 450 noted above. Computer system 900 may contain one or more processors such as central processing unit (CPU) 910, random access memory (RAM) 920, secondary memory 930, graphics controller 960, display unit 970, network interface 980, and input interface 990. All the components except display unit 970 may communicate with each other over communication path 950, which may contain several buses as is well known in the relevant arts. The components of FIG. 9 are described below in further detail.

CPU 910 may execute instructions stored in RAM 920 to provide several features of the present invention (by performing tasks corresponding to various approaches described above). CPU 910 may contain multiple processing units, with each processing unit potentially being designed for a specific task. Alternatively, CPU 910 may contain only a single processing unit. RAM 920 may receive instructions from secondary memory 930 using communication path 950.

Graphics controller 960 generates display signals (e.g., in RGB format) to display unit 970 based on data/instructions received from CPU 910. Display unit 970 contains a display screen to display the images defined by the display signals. Input interface 990 may correspond to a key-board and/or mouse, and generally enables a user to provide inputs. Network interface 980 enables some of the inputs (and outputs) to be provided on network of FIG. 3. In general, display unit 970, input interface 990 and network interface 980 enable top level and block designer to interact according to various features described above.

Secondary memory 930 may contain hard drive 931, flash memory 936 and removable storage drive 937. Secondary storage 930 may store the software instructions (which perform the actions specified by various flow charts above) and data (e.g., topology of the modules, cell libraries and determined EM and IR drop values corresponding to each path), which enable computer system 900 to provide several features in accordance with the present invention. Some or all of the data and instructions may be provided on removable storage unit 940, and the data and instructions may be read and provided by removable storage drive 937 to CPU 910. Floppy drive, magnetic tape drive, CD-ROM drive, DVD Drive, Flash memory, removable memory chip (PCMCIA Card, EPROM) are examples of such removable storage drive 937.

Removable storage unit 940 may be implemented using medium and storage format compatible with removable storage drive 937 such that removable storage drive 937 can read the data and instructions. Thus, removable storage unit 940 includes a computer readable storage medium having stored therein computer software and/or data. An embodiment of the present invention is implemented using software running (that is, executing) in computer system 900.

In this document, the term "computer program product" is used to generally refer to removable storage unit 940 or hard disk installed in hard drive 931. These computer program products are means for providing software to computer system 900. As noted above, CPU 910 may retrieve the software instructions, and execute the instructions to provide various features of the present invention.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of facilitating development of a design for an integrated circuit, said integrated circuit being divided into a plurality of blocks, said method being performed in one or more digital processing systems, said method comprising:

receive data indicating a plurality of blocks contained in said integrated circuit;

determine completion of design of blocks of interest up to a checkpoint;

make available to a top level the design data for the blocks up to said checkpoint, wherein the design of said integrated circuit is validated up to said checkpoint using the design data received from all the blocks;

enabling a user designing a first block to indicate that designing of said first block is complete up to said checkpoint, wherein said first block is contained in said plurality of blocks;

wherein the results of designing said first block up to said checkpoint is made available to said top level only after said user indicates that designing said first block is complete up to said checkpoint; and wherein a designer at said top level can send a new version of input files to said block designer, wherein said new version of input files are used as inputs for a corresponding stage of design of a corresponding block.

2. The method of claim 1, further comprising:

receiving data indicating the specific information to be provided after reaching said checkpoint, wherein the indicated specific information corresponding to said first block is provided to top level after said user indicates that designing up to said checkpoint of said first block is complete.

3. The method of claim 2, wherein said specific information is contained in a plurality of files, said plurality of files being generated by a design tool used to design said first block up to said checkpoint, wherein said specific information is indicated by extensions of identifiers of said files.

4. The method of claim 3, further comprising:

copying said plurality of files to an outbox after said user indicates that designing of said first block is complete up to said checkpoint.

5. The method of claim 4, further comprising:

providing a notification to another user performing validation at said top level that said checkpoint is reached; and enabling said another user to copy said plurality of files to a location where said plurality of files are used by said top level.

6. The method of claim 5, further comprising:

providing a view of a corresponding stage/checkpoint at which the design of each of said plurality of blocks is presently at.

7. The method of claim 1, further comprising sending a message and a modified input file to said user indicating any problems detected associated with said first block in performing validation at said top level.

8. The method of claim 7, wherein said message and said modified input file is placed in an inbox associated with said user.

9. The method of claim 1, wherein a non-last stage corresponding to said checkpoint comprises detailed routing, wherein a plurality of checkpoints are specified associated with said detailed routing, wherein said plurality of checkpoints comprise timing checkpoint, cross talk noise checkpoint, signal EM checkpoint, and cross talk delay checkpoint.

10. A computer readable medium carrying one or more sequences of instructions for causing one or more systems to facilitate development of a design for an integrated circuit, said integrated circuit being divided into a plurality of blocks, wherein execution of said one or more sequences of instructions by one or more processors contained in said system causes said one or more processors to perform the actions of:

receive data indicating a plurality of blocks contained in said integrated circuit;

determine completion of design of blocks of interest up to a checkpoint;

make available to a top level the design data for the blocks up to said checkpoint, wherein the design of said integrated circuit is validated up to said checkpoint using the design data received from all the blocks;

enabling a user designing a first block to indicate that designing of said first block is complete up to said checkpoint, wherein said first block is contained in said plurality of blocks, wherein the results of designing said first block up to said checkpoint is made available to said top level only after said user indicates that designing said first block is complete up to said checkpoint; and wherein a designer at said top level can send a new version of input files to said block designer, wherein said new version of input files are used as inputs for a corresponding stage of design of a corresponding block.

11. The computer readable medium of claim 10, further comprising:

receiving data indicating the specific information to be provided after reaching said checkpoint, wherein the indicated specific information corresponding to said first block is provided to top level after said user indicates that designing up to said checkpoint of said first block is complete.

12. The computer readable medium of claim 11, wherein said specific information is contained in a plurality of files, said plurality of files being generated by a design tool used to design said first block up to said checkpoint, wherein said specific information is indicated by extensions of identifiers of said files.

13. The computer readable medium of claim 12, further comprising:

copying said plurality of files to an outbox after said user indicates that designing of said first block is complete up to said checkpoint.

14. The computer readable medium of claim 13, further comprising:

providing a notification to another user performing validation at said top level that said checkpoint is reached; and enabling said another user to copy said plurality of files to a location where said plurality of files are used by said top level.

15. The computer readable medium of claim 14, further comprising:

providing a view of a corresponding stage/checkpoint at which the design of each of said plurality of blocks is presently at.

16. The computer readable medium of claim 10, further comprising sending a message and a modified input file to said user indicating any problems detected associated with said first block in performing validation at said top level.

17. The computer readable medium of claim 16, wherein said message and said modified input file is placed in an inbox associated with said user.

18. The computer readable medium of claim 10, wherein a non-last stage corresponding to said checkpoint comprises detailed routing, wherein a plurality of checkpoints are specified associated with said detailed routing, wherein said plurality of checkpoints comprise timing checkpoint, cross talk noise checkpoint, signal EM checkpoint, and cross talk delay checkpoint.

* * * * *